(12) United States Patent
Mizuno

(10) Patent No.: US 6,304,124 B1
(45) Date of Patent: *Oct. 16, 2001

(54) VARIABLE DELAY CIRCUIT

(75) Inventor: Masayuki Mizuno, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/020,574

(22) Filed: Jan. 29, 1998

(30) Foreign Application Priority Data

Jan. 29, 1997 (JP) .................................................. 9-015594

(51) Int. Cl.$^7$ .................................................. H03H 11/26
(52) U.S. Cl. ............................ 327/281; 327/276; 327/288
(58) Field of Search ........................... 327/276, 277, 327/278, 281, 284, 285, 288; 331/57

(56) References Cited

U.S. PATENT DOCUMENTS

| | | | |
|---|---|---|---|
| 4,458,165 | * | 7/1984 | Jackson .................................. 327/276 |
| 5,039,893 | * | 8/1991 | Tomisawa ............................. 327/276 |
| 5,111,085 | * | 5/1992 | Stewart ................................. 327/278 |
| 5,121,014 | * | 6/1992 | Huang ................................... 327/276 |
| 5,440,260 | * | 8/1995 | Hayashi et al. ....................... 327/278 |
| 5,708,396 | * | 1/1998 | Mizuno .................................. 331/57 |
| 5,859,554 | * | 1/1999 | Higashisaka et al. ................ 327/281 |
| 5,898,321 | * | 4/1999 | nkbahar et al. ...................... 326/87 |
| 5,917,758 | * | 6/1999 | Keeth ............................... 365/189.05 |

FOREIGN PATENT DOCUMENTS

| | | |
|---|---|---|
| 53057731 | 5/1978 | (JP) . |
| 61-224616 | 10/1986 | (JP) . |
| 62274913 | 11/1987 | (JP) . |
| 4978927 | 12/1990 | (JP) . |
| 5-136664 | 6/1993 | (JP) . |
| 5268002 | 10/1993 | (JP) . |
| 7-170162 | 7/1995 | (JP) . |
| 7202646 | 8/1995 | (JP) . |
| 8-102643 | 4/1996 | (JP) . |

* cited by examiner

Primary Examiner—Terry D. Cunningham
Assistant Examiner—Quan Tra

(57) ABSTRACT

A variable delay section comprises a gate element and a plurality of (N) delay elements for delaying the signal change on the output of the gate element. A difference between a first delay provided by n-th delay section and a second delay provided by (n+1)th delay section is constant for any of n's between 1 and N−1. A plurality of variable delay sections are cascaded to form a frequency multiplier, with the output of the last stage variable delay section being fed-back to the input of the first stage variable delay section through a selector. The other input of the selector is connected to the input of the variable delay circuit to allow the internal signal to pass the variable delay sections for K times.

9 Claims, 10 Drawing Sheets

VARIABLE DELAY CIRCUIT

BACKGROUND OF THE INVENTION (a) Field of the Invention

The present invention relates to a variable delay circuit and, more particularly, to a variable delay circuit for providing a variable delay time capable of being controlled by a set of control signals.

(b) Description of the Related Art

A variety of variable delay circuits have been proposed each providing a variable delay time capable of being controlled by a set of control signals supplied from outside the circuit. Since the variable delay circuit can be designed to implement a voltage controlled oscillator by connecting the output of the variable delay circuit with the input thereof for a negative feedback loop, it is sometimes described as a programmable voltage controlled oscillator.

U.S. Pat. No. 4,978,927 to Hausman et al. discloses a programmable voltage controlled oscillator shown in FIG. 1. The voltage controlled oscillator has three basic gate circuits 202, 204 and 206, a first gate circuit 232 and a second gate circuit 226, all of which are connected to form a ring oscillator, with one of two signal paths in each of the basic gate circuits 202, 204 and 206 being selected by selecting a set of control signals "A", "B" and "C" to selectively short-cutting a signal path portion of the ring oscillator. By this configuration, the voltage controlled oscillator achieves a variable oscillator frequency.

Patent Publication JP-A-5(1993)-268002 proposes another voltage controlled oscillator shown in FIG. 2, wherein a NAND gate 305 including an associated transistor N52 and a plurality of inverters 301 to 304 each including an associated transistor N12, N22, n32 or N42 are cascaded, with the output of the last stage inverter 304 being fed-back to the first input of the NAND gate 305. The current of each of the NAND gate 305 and inverters 301 to 304 is controlled by the associated transistors receiving an analog control signal "IN" for controlling the ON-resistance of the associated transistors, thereby obtaining a variable delay time in the voltage controlled oscillator. The NAND gate 305 also receives a control signal CR through the second input thereof for starting or stopping the oscillation. In this configuration, a wide range of oscillator frequency can be obtained.

In the conventional voltage controlled oscillators as mentioned above, there is a problem in that the gains of the voltage controlled oscillators of the same design differ from each other due to the variation caused by a fabrication process or the gain of a voltage controlled oscillator changes with the change of the operational temperature. This is common to a digital circuit and an analog circuit. The term "gain" as used herein means the ratio of the amount of the change in the resultant delay time to the amount of the change in the control signal (set of control signals), which may be expressed in terms of either analog or digital magnitude, supplied to the voltage controlled oscillator which is operating to provide a desired delay. For example, the delay of a typical basic gate formed by transistors generally ranges between about 0.5 times and 2.0 times normal delay, which involves the gain of the voltage controlled oscillator ranging between 0.5 and 2.0.

In addition, in the voltage controlled oscillator disclosed in U.S. Pat. No. 4,978,927, the delay can be controlled stepwise specified by a unit time corresponding to the delay of each basic gate circuit. Accordingly, a finer adjustment cannot be obtained. This is peculiar to the case of the digital circuit. For example, the delay of a basic gate is about 100 pico-second (ps) in the case of 0.2 $\mu$m CMOS-LSI ata source voltage of 2.5 volts, which limits the unit delay to 100 ps.

In the case of the voltage controlled oscillator described in JP-A-5-268002, since the control range is limited by a source voltage, a higher gain causes the oscillator to be more susceptible to noise. This is peculiar to the case of an analog circuit. Specifically, the control range of an analog control signal generally depends on the source voltage. Accordingly, if a wide range of the delay is desired for the voltage controlled circuit, it is generally achieved by a large gain of the voltage controlled oscillator, which causes that only small noise in the control signal generates large noise in the output delay.

SUMMARY OF THE INVENTION

It is a primary object of the present invention to provide a new variable delay circuit.

It is an additional object of the present invention to provide a variable delay circuit capable of providing a high accuracy of the gain irrespective of the variations in the device characteristics caused by the fabrication steps or the operational temperature or less susceptible to noise in the control signal.

The present invention provides, in a first aspect thereof, a variable delay circuit comprising a gate element for receiving a first signal to output a second signal corresponding to the first signal through an output line, and a plurality of (N) delay elements each having a control input f or receiving a corresponding one of a set of N control signals to delay a signal change of the second signal, wherein a difference between a first delay provided by an n-th delay element and a second delay provided by an (n+1) th delay element is substantially constant for any of n's between 1 and N−1.

The present invention also provides, in a second aspect thereof, a variable delay circuit comprising a plurality of cascaded variable sections each having: a gate element for receiving a first signal to output a second signal corresponding to the first signal; and a plurality of (N) delay elements each having a control input f or receiving a corresponding one of a set of N control signals to delay a signal change of the second signal.

In accordance with the variable delay circuit of the preferred embodiment, a wide range for the delay can be obtained in a single variable delay circuit with a fine control of delay.

The above and other objects, features and advantages of the present invention will be more apparent from the following description, referring to the accompanying drawings.

PREFERRED EMBODIMENTS OF THE INVENTION

Figure 1:
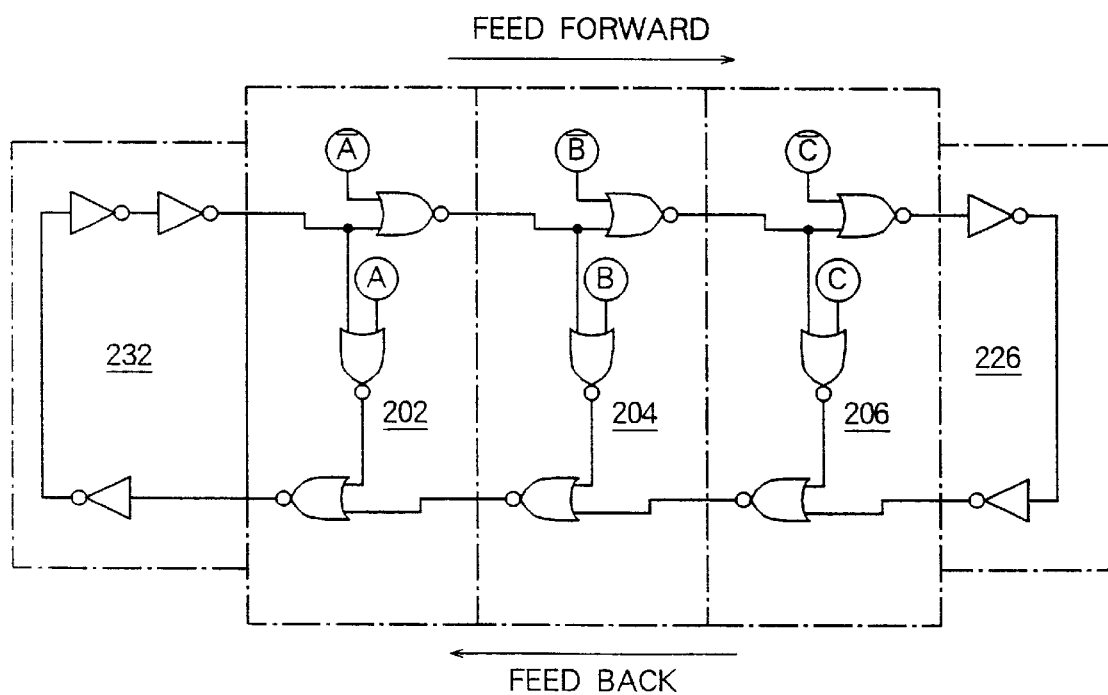
FIG. 1 is a block diagram of a conventional variable delay circuit.
Figure 2:
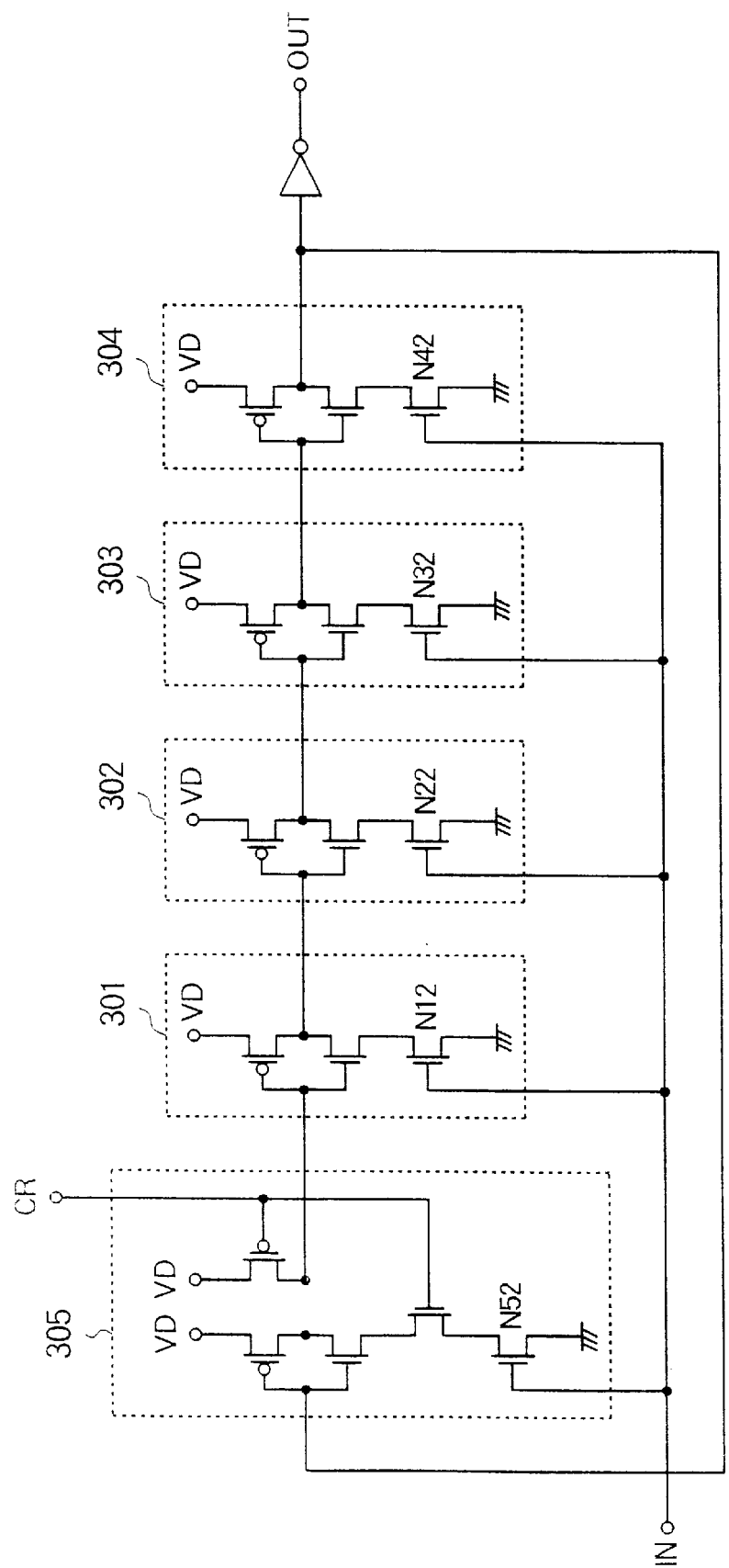
FIG. 2 is a circuit diagram of another conventional variable delay circuit.

Now, the present invention is more specifically described with reference to accompanying drawings, wherein similar constituent elements are designated by the same or similar reference numerals.

Figure 3:
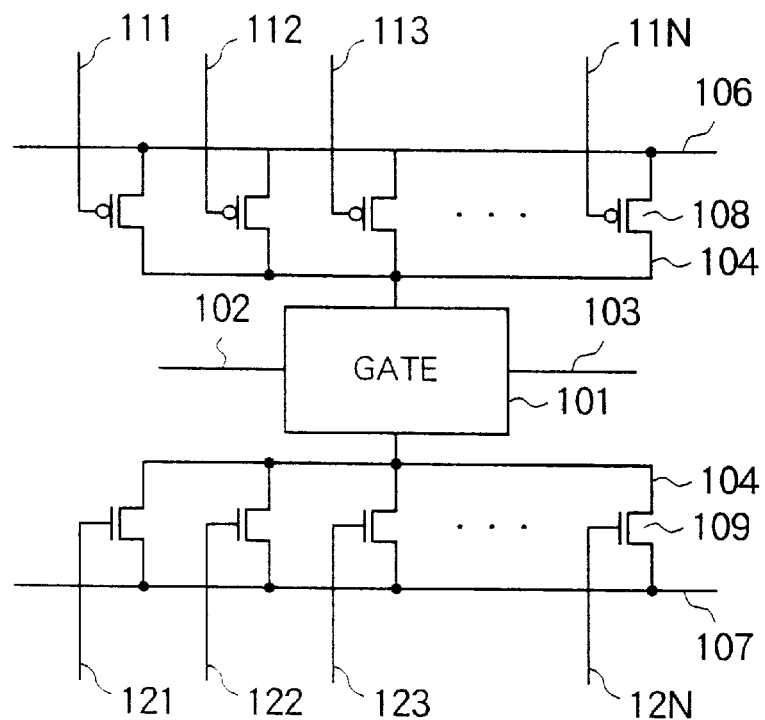
FIG. 3 is a circuit diagram of a variable delay circuit according to a first embodiment of the present invention.

Referring to FIG. 3, a variable delay circuit according to a first embodiment of the present invention comprises a gate element 101 having an input 102 for receiving an input signal for the voltage controlled oscillator, an output 103 for supplying an output signal having a desired delay from the input signal, a first current terminal 104 and a second current terminal 105 for operation, a plurality of (N≧2) parallel p-channel MOSFETs (pMOSFETs) 108 each having a source connected to a first source line 106, a drain connected to the first current terminal 104 of the gate element 101 and a gate connected to a corresponding one of control lines 111 to 11N and a plurality of (N≧2) parallel n-channel MOSFETs (nMOSFETs) 109 each having a source connected to a second source line 107, a drain connected to the second current terminal 105 of the gate element 101 and a gate connected to a corresponding one of control lines 121 to 12N. N pMOSFETs 108 have respective channel widths (w) and respective channel lengths (L) to provide respective ON-currents for the gate element 101, whereas N nMOSFETs 109 have respective channel (W) widths and respective channel lengths (L) to provide respective ON-currents for the gate element 101 together with pMOSFETs 108 which are ON.

Figure 4:
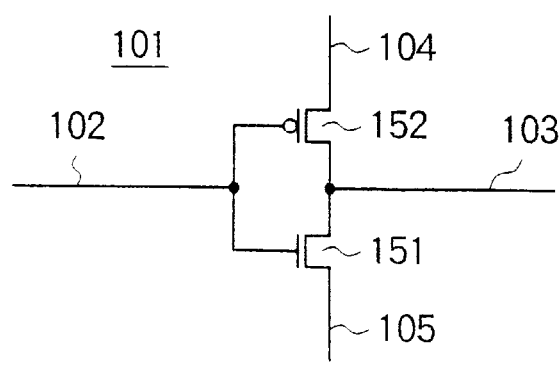
FIG. 4 is an example of the gate element shown in FIG. 3.

Referring to FIG. 4, the gate element 101 shown in FIG. 3 is implemented as a CMOS inverter including an nMOSFET 151 and a pMOSFET 152 connected in series between the first current terminal 104 and the second current terminal 105 and having a common gate input 102 for receiving an input signal of the variable delay circuit. The gate element 101 supplies an output signal corresponding to the input signal through the output terminal 103. The gate element 101 may be any other logic gate, such as AND-, NAND- or OR-gate or a combination thereof, having inputs other than the signal input fixed or controlled.

In the configuration of FIG. 3, the current flowing through the gate element 101 depends on a specific pair or specific pairs of p-MOSFETs 108 and nMOSFETs 109 which are driven by a set of control signals 111 to 11N, thereby changing the delay time of the output signal 103. In this configuration, each MOSFET provides corresponding ON-current for the gate element 101, thereby accelerating the signal changes on the output 103 of the gate element 101. Nevertheless, the MOSFETs are called in this text "delay elements" because each MOSFET provides a delay upon the turn-off thereof when the variable delay circuit is in operation. In the above configuration, either pMOSFETs or nMOSFETs may be provided for the gate element, with the current of the gate element being connected to the corresponding source line.

Assuming that the total ON-current of the pMOSFETs 108 which are now driven is equal to the total ON-current of the nMOSFETs which are now driven and the same ON-current is represented by "I", the delay time of the variable delay circuit of the present embodiment is proportional to 1/I. If it is assumed that only one of the pMOSFETs 108 and a corresponding one of the nMOSFETs 109 are ON, the delay time of the variable delay circuit of the present embodiment can be selected depending on the selection of the specific pair among the pairs of pMOSFET 108 and nMOSFET 109.

In the description to follow, it is assumed that n-th (1≦n≦N) pMOSFET and n-th nMOSFET are ON, with other MOSFETs being OFF, at any time in the delay section, and the ON-current is represented by I (n) in a configuration wherein a larger number for "n" both in the n- th PMOSFET and in the n-th nMOSFET provides a larger ON-current I(n). As a more specific example of this configuration, n-th pair of transistors (1≦n≦N) may provide current magnitude of n units for any of n's, as will be exemplified later.

I(n) changes depending on the variations of the condition in the fabrication process thereof and on the operational temperature, which are called sometimes simply "process condition". The condition in the fabrication process which effects variation of I(n) includes dosage of the channel region, thickness of the gate oxide films, gate length in the MOSFETs etc.

I(n) varies from a minimum of I(n), which is expressed herein as $I_{min}(n)$, to a maximum of I(n), which is expressed as $I_{max}(n)$, with a typical value of I(n), which is expressed as $I_{typical}(n)$, sandwiched therebetween. The process conditions at which the device having $I_{min}(n)$, $I_{typical}(n)$ and $I_{max}(n)$ are fabricated are called herein a best condition, a typical condition and a worst condition, respectively. In view of the variations in the standard process for fabricating the MOSFETs and the normal operational temperature, the following relationships generally hold:

$I_{min}(n)=2 \times I_{typical}(n)$, and $2 \times I_{typical}(n)=I_{max}(n)$.

Accordingly, a specified set of control signals provides a variation in the delay time ranging between ½ and 2 times the typical delay time.

In other words, if a desired delay time can be obtained by a specific ON-current "I", the "n" in the n-th pair of pMOSFETs and nMOSFETs providing the ON-current "I" depends on the process condition, i.e., "n" for the best condition, and for the typical condition and "n" for the worst condition differ from one another: $n_{,best} \approx n_{,typical}$, $n_{,typical} \approx n_{,worst}$, and $n_{,best} \approx n_{,worst}$.

In the variable delay circuit of the present embodiment, the ON-currents of the N nMOSFETs and the N pMOSFETs are designed so that the amount of the change in the delay time when a pair of MOSFETs in an ON-state is changed from "n" to n+1 or n−1 is a unit time length for any of n's, thereby obtaining a constant gain.

Specifically, the ON-currents of the pMOSFETs and nMOSFETs are selected so that the following relationships hold:

$(I(n_{.best}+1)+I(n_{.best}-1))/2=I(n_{.best})$, $(I(n_{.worst}+1)+I(n_{.worst}-1))/2=I(n_{.worst})$, and $(I(n_{.typical}+1)+I(n_{.typical}-1))/2=I(n_{.typical})$.

Such adjustment of the ON-currents of the MOSFETs can be achieved by selecting the design channel widths and design channel lengths of the MOSFETs, for example, at specified sets of values. By this configuration, after a desired delay is obtained in the variable delay circuit, a constant amount in the stepwise change of delay time can be obtained by selecting a pair of MOSFETs for an ON-state in the order of "n" among the N pairs of MOSFETs.

Figure 5:
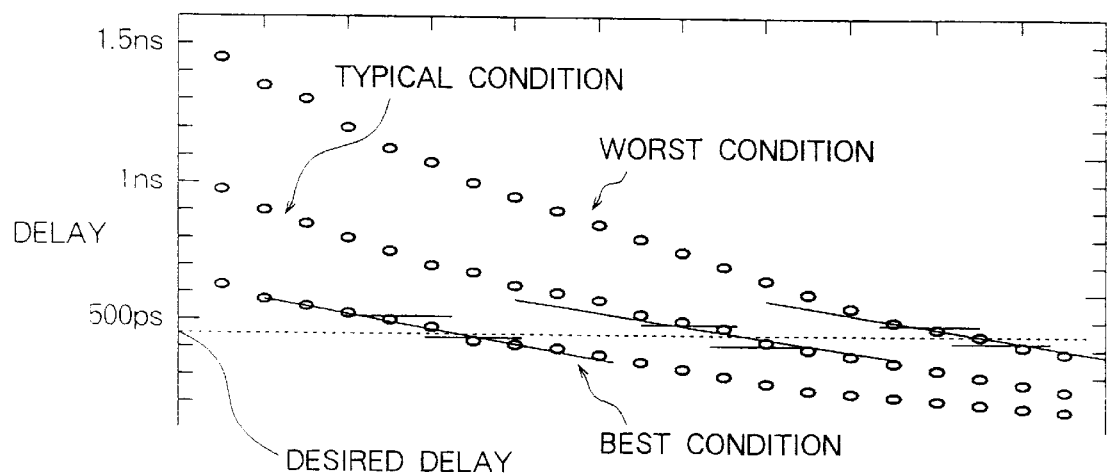
FIG. 5 is a graph for showing the delay achieved by the first embodiment.

Referring to FIG. 5 showing the change in the delay time for the case of N=21 under the process conditions of best, typical and worst conditions, and a desired delay at 500 ps. In the figure, a pair of MOSFETs is selected in the order of "n" between 1 and N. and each dot or point corresponds to a pair of MOSFETS that are turned ON among the N pairs for obtaining a specific delay.

The step difference in the ON-current between the adjacent pairs of MOSFETs is adjusted at a constant in the N (21) pairs of MOSFETs for obtaining the constant step gain irrespective of the variations in the characteristics of the MOSFETs due to the different process conditions. This is shown by the equal gradient in the three lines each passing the horizontal line of 500 ps.

FIG. 5 also shows how the delay time changes depending on the process conditions for the three cases, i.e., best, worst and typical conditions. It is to be noted that, in a practical device, the curve resides between the best condition and the worst condition, and the practical curve is represented in FIG. 5 by the specific three cases.

As understood from FIG. 5, a specified delay of 500 ps is obtained by the 18th pair fabricated under the worst condition (i.e., n.worst=18), the 13th pair under the typical condition (i.e., n.typical=13) and the 6th pair under the best condition (i.e., n.best=6) In the respective conditions, the gain, or rate of change obtained by incrementing or decrementing the value for "n" by one, is maintained constant. This is achieved by the configuration that the ON-currents of the 21 pairs of MOSFETs are adjusted so that the rate of change in the delay (or the rate of change in the ON-current) is lowered along the increase of the value for "n" of the n-th pair of MOSFETS.

Since the delay and the On-current are in reverse proportion to each other, the formula of the current can be used for the formula for expressing the delay. Specifically, the ON-current "I" of MOSFETs are generally expressed as:

$I=bW/\{aL(VDD-VT)\}$, wherein "a" and "b" are constants, and W and L are channel width and channel length, respectively. VDD (source voltage) and VT (threshold voltage) are constants in the design of MOSFETs in an LSI, and accordingly, the delay, which is in proportion to an inverse of "I", can be expressed in terms of L/W as a parameter.

Table 1 lists channel width W($\mu$m) of the MOSFETs shown in FIG. 5 with the channel length L maintained at 0.35 $\mu$m. Table 1 was obtained in the case of source voltage at 3.3 volts, thickness of the gate oxide film at 80 angstroms, threshold voltage VT at 0.6 volts for both the nMOSFETs and pMOSFETs, the ON-currents of the nMOSFETs and pMOSFETs at 4 mA and −2 mA, resepectively, for W=10 $\mu$m (design value), channel widths for the pMOSFETs 152 and nMOSFETs 151 in the gate element 101 at 32 $\mu$m and 16 $\mu$m, respectively.

TABLE 1

| Number "n" | W for pMOSFET | W for nMOSFET |
|---|---|---|
| 1 | 4.0 | 2.0 |
| 2 | 4.2 | 2.1 |
| 3 | 4.6 | 2.3 |
| 4 | 4.8 | 2.4 |
| 5 | 5.0 | 2.5 |
| 6 | 5.2 | 2.6 |
| 7 | 5.4 | 2.7 |
| 8 | 5.6 | 2.8 |
| 9 | 6.0 | 3.0 |
| 10 | 6.2 | 3.1 |
| 11 | 6.8 | 3.4 |
| 12 | 7.2 | 3.6 |
| 13 | 7.6 | 3.8 |
| 14 | 8.4 | 4.2 |
| 15 | 9.2 | 4.6 |
| 16 | 10.0 | 5.0 |
| 17 | 11.6 | 5.8 |
| 18 | 13.6 | 6.8 |
| 19 | 18.0 | 9.0 |
| 20 | 23.4 | 11.7 |
| 21 | 32.0 | 16.0 |

Figure 6:
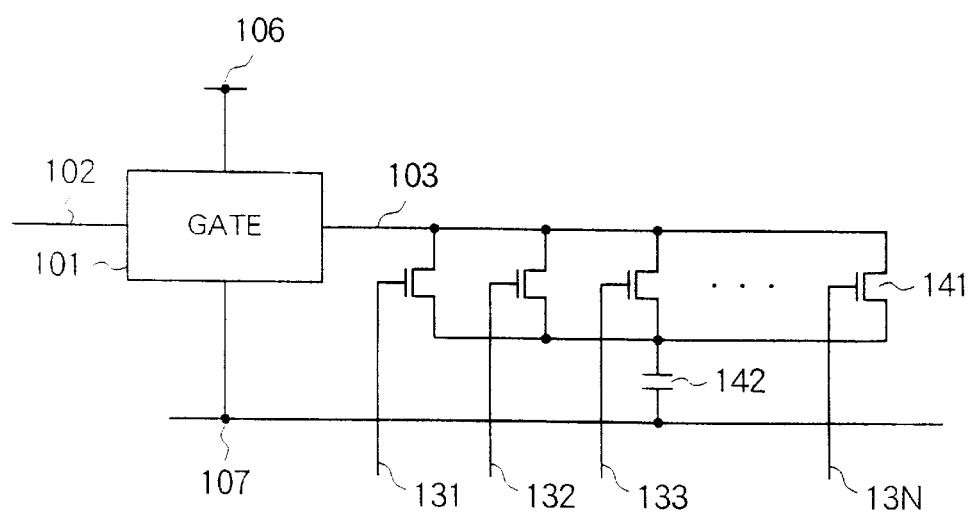
FIG. 6 is a circuit diagram of a variable delay circuit according to a second embodiment of the present invention.

Referring to FIG. 6, a variable delay circuit according to a second embodiment of the present invention comprises a gate element 101, which is similar to that shown in FIG. 4, connected between source lines 106 and 107 and having an input 102 and an output 103, and a plurality (N) of parallel nMOSFETs 141 connected in series with a capacitor 142 between the output line 103 of the gate element 101 and the low potential source line 107.

Specifically, the combination of the plurality of MOSFETs 141 and the capacitor 142 constitutes an RC network, wherein the resistance R is controlled by a set of control signals supplied to the gate electrodes 131 to 13N of the nMOSFETs 141. The capacitance of the capacitor 142 is preferably set between 100 fF and 500 fF for a set of L/W's for the nMOSFETs 141 similar to those of the first embodiment.

In FIG. 6, assuming that the total ON-current of nMOSFETs 141 which are ON due to a specific set of control signals is expressed by "I", the delay is in proportion to 1/I. By employing a configuration that the ON-currents of the respective N nMOSFETs are designed similarly to those in the first embodiment, the rate of change in the delay can be maintained constant for any of n's in the n-th MOSFETs.

Figure 7:
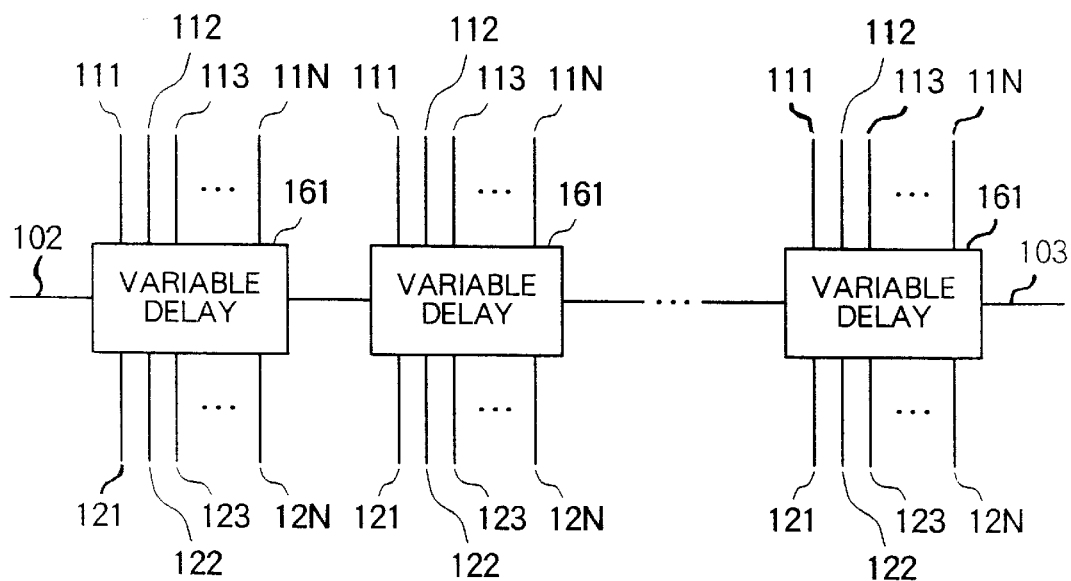
FIG. 7 is a block diagram of a variable delay circuit according to a third embodiment of the present invention.

Referring to FIG. 7, a variable delay circuit according to a third embodiment of the present invention comprises a plurality (M) of cascaded delay sections 161 each implemented by a variable delay circuit of FIG. 3. Each delay section 161 is controlled by a common set of control signals supplied through control lines 111 to 11N and 121 to 12N of the each delay section 161. The variable delay circuit of FIG. 7 achieves a wider control range for the delay time which is M times the control range of the variable delay circuit of FIG. 3.

Figure 8:
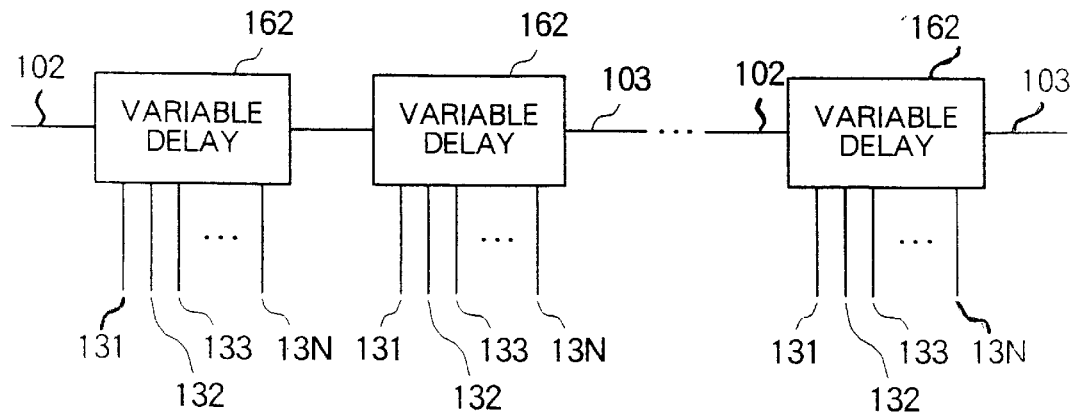
FIG. 8 is a block diagram of a variable delay circuit according to a fourth embodiment of the present invention.

Referring to FIG. 8, a variable delay circuit according to a fourth embodiment of the present invention comprises a plurality (M) of cascaded delay sections 162 each implemented by the variable delay circuit of FIG. 6. Each delay section 162 is controlled by a common set of control signals supplied through control lines 131 to 13N of the each control section 162. The variable delay circuit of FIG. 7 achieves a wider control range for the delay time which is M times the control range of the variable delay circuit of FIG. 6.

Figure 9:
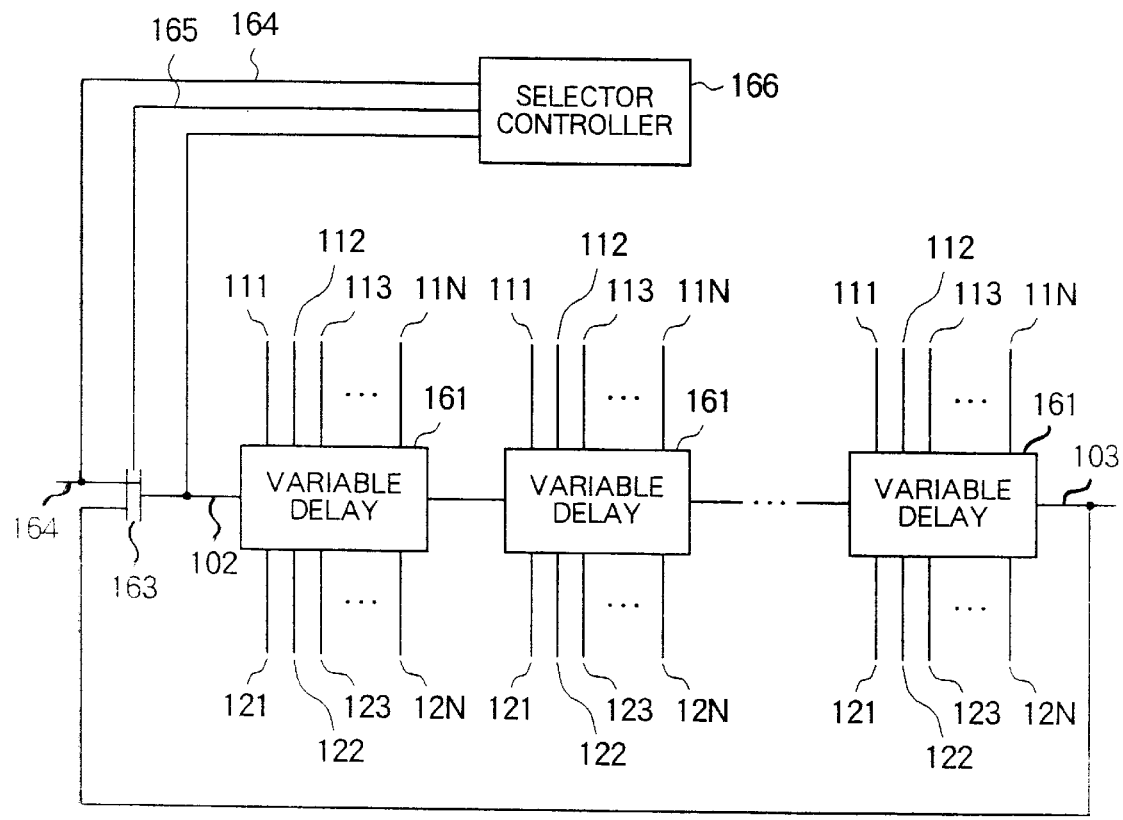
FIG. 9 is a block diagram of a variable delay circuit according to a fifth embodiment of the present invention.

Referring to FIG. 9, a variable delay circuit according to a f if th embodiment of the present invention comprises a variable delay block similar to the variable delay circuit of FIG. 7 and including a plurality (M) of variable delay sections 161, a selector 163 having a first input connected to the input 164 of the variable delay circuit, a second input connected to the output 103 of the last stage (M-th) variable delay section 161 and an output connected to the input of the first stage delay section 161, and a selector controller 166 having a reset input connected to the input signal line 164, a count input connected to the input 102 of the first stage delay section 161 and a control output 165 for controlling the selector 163 for selection of one of the inputs 163 and 164.

Figure 10:
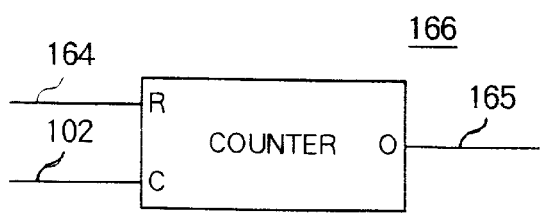
FIG. 10 is a block diagram of an example for the selector controller shown in FIG. 9.

Referring to FIG. 10 showing an example of the selector controller 166 shown in FIG. 9, the selector controller 166 is implemented by a counter having a reset input 164, a count input 102 and an output 165. The counter 166 has a setting of K/2 for counting which is specified from outside, is reset for counting by an input signal 164, counts pulses supplied through the count line 102, and outputs a control signal through the control line 165.

Figure 11:
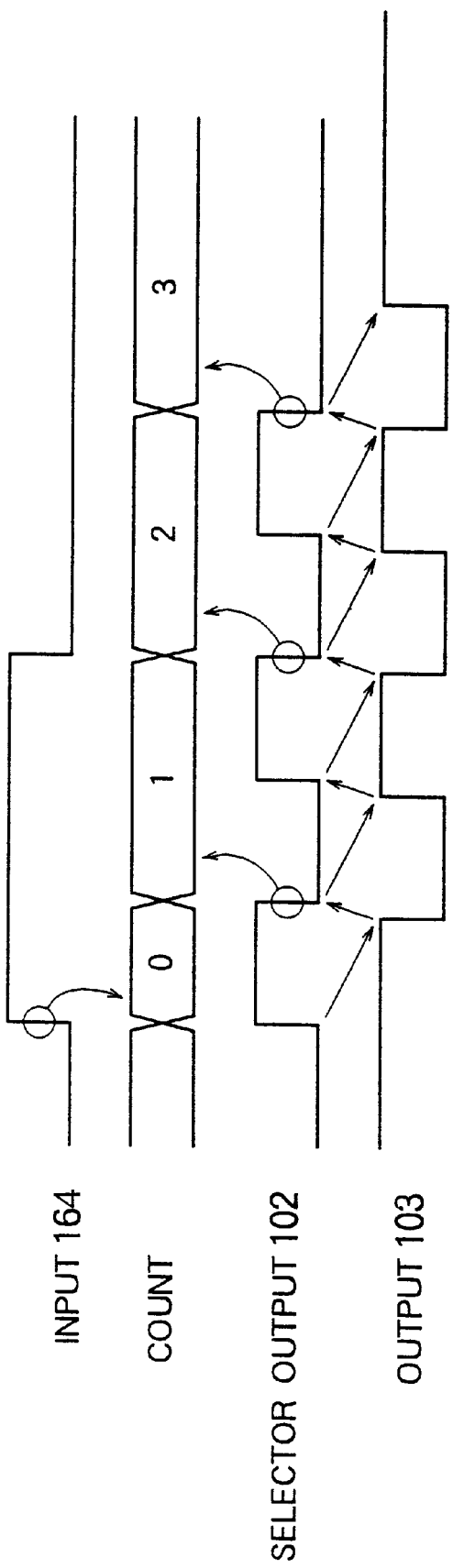
FIG. 11 is a timing chart of the variable delay circuit of FIG. 9.

FIG. 11 shows the timing chart of the variable delay circuit of FIG. 9. Referring to FIGS. 9 and 11, the selector controller 166 is reset at the rising edge of the input signal 164, then counts the falling edges of the signal 102, i.e., input of the first stage variable delay section 161. The selector controller 166 activates the control signal 165 while the counts thereof is between zero and K/2-1, and otherwise inactivates the control signal 165. When the control signal 165 is active, the selector 163 selects the output line 103 of the last stage variable delay section 161, which is opposite in phase to the input signal 164, to connect the same with the input 102 of the first stage variable delay section 161, and selects the input signal 164 to connects the same with the input 102 of the first stage variable delay section 161 when the control signal 165 is inactive.

By the configuration as described above, as shown in FIG. 11, the internal signal activated by the input signal 164 passes the selector 163 and the M variable delay sections for K times (K=6 in this example) until the counter 166 counts up to the setting of K/2. In FIG. 11, the arrows extending from the signal line 102 toward the signal line 103 mean the propagation delay for the internal signal through the M variable delay sections 161, and the arrows extending from the signal line 103 toward the signal line 102 mean the internal signal passing through the selector 163, wherein the number of arrows extending from the signal line 102 toward the signal line 103 is six, which means K=6 for the setting of K/2 in the selector controller 166.

Assuming that input signal 164 has a frequency of "f", and that the control signals 111 to 11N and 121 to 12N for the M variable delay sections 161 are controlled based on a phase locked loop technique so that the rising edge of the output signal 103 coincides with the rising edge of the input signal 164 at the instant of the count up of K/2 by the selector controller 166, the output signal 103 has a frequency of f×K/2, namely, a product of the input frequency and K/2. In the present embodiment, the variable delay circuit is implemented as a voltage controlled oscillator or frequency multiplier. If the variable delay circuit of FIG. 9 is to be used for obtaining a desired delay signal, another counter may be provided for counting the signal on the output line 103 to output a delayed signal after counting the output signals for desired times.

In the above configuration, the control range for the delay time can be expanded up to W×M×K wherein "W" is the control range for the time delay which is implemented by the control inputs 111 to 11N and 121 to 12N.

Figure 12:
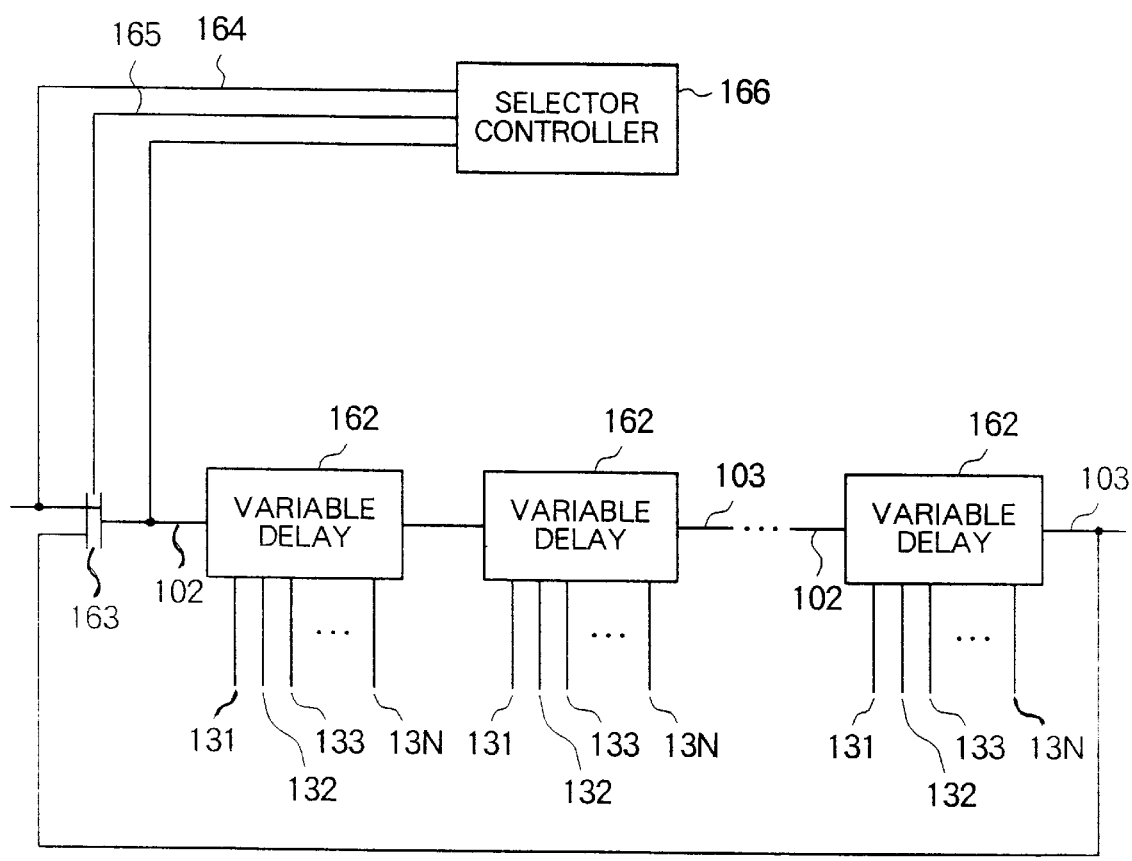
FIG. 12 is a block diagram of a variable delay circuit according to a sixth embodiment of the present invention.

Referring to FIG. 12, a variable delay circuit according to a sixth embodiment of the present invention is similar to the fifth embodiment except that a plurality of (M) variable delay sections 162, which are similar to those shown in FIG. 8, are provided in the variable delay circuit of the present invention. In this configuration, the selector controller 166 controls the selector 163 so that the internal signal passes the M delay sections for K times, similarly to FIG. 9. The variable delay circuit of the present embodiment is implemented as a frequency multiplier, similarly to the fifth embodiment.

Figure 13:
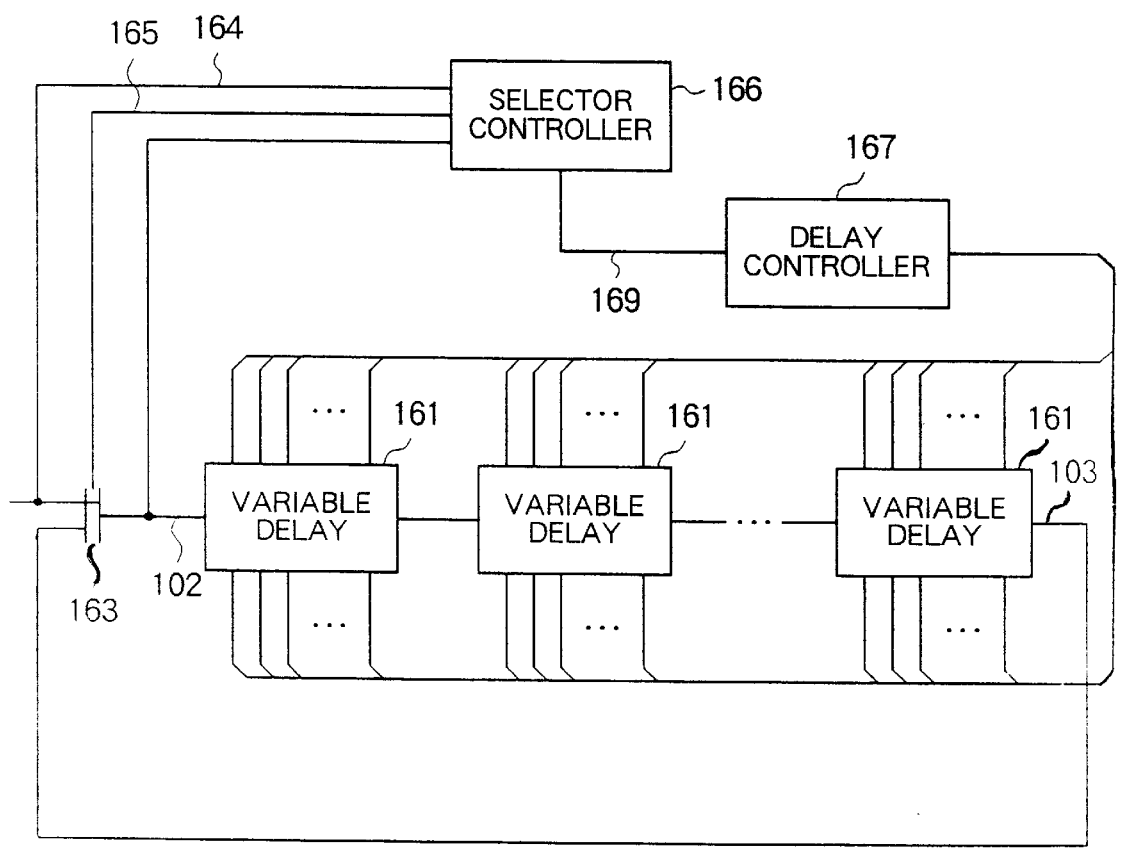
FIG. 13 is a block diagram of a variable delay circuit according to a seventh embodiment of the present invention.

Referring to FIG. 13, a variable delay circuit according to a seventh embodiment of the present invention is similar to the variable delay circuit of FIG. 9 except that a delay controller or delay control section 167 provided in the present embodiment selects the control inputs of the delay sections 161 independently from one another section 161 based on the present count in the selector controller 166.

Specifically, the delay control section 167 receives each count from the selector controller 166 through a count line 169 and selects a larger delay for each of the delay sections 161 or specified delay sections 161 at an even count, for example, and selects a smaller delay for each of the delay sections 161 or the specified delay sections 161 at an odd count, for example. Alternatively, the delay control section 167 may select a larger delay at an initial stage of the counts and select a smaller delay at the subsequent stage of the counts. In this configuration, if each delay section 161 has P different sets of control inputs, the variable delay circuit of the present embodiment has P×M×K/2 sets for the overall combinations of the effective control inputs, which is improved from the embodiment of FIG. FIG. 9 by K/2. In other words, unit change rate for the delay is reduced down to 2/K between adjacent sets of control inputs to obtain a fine control for the delay time.

Figure 14:
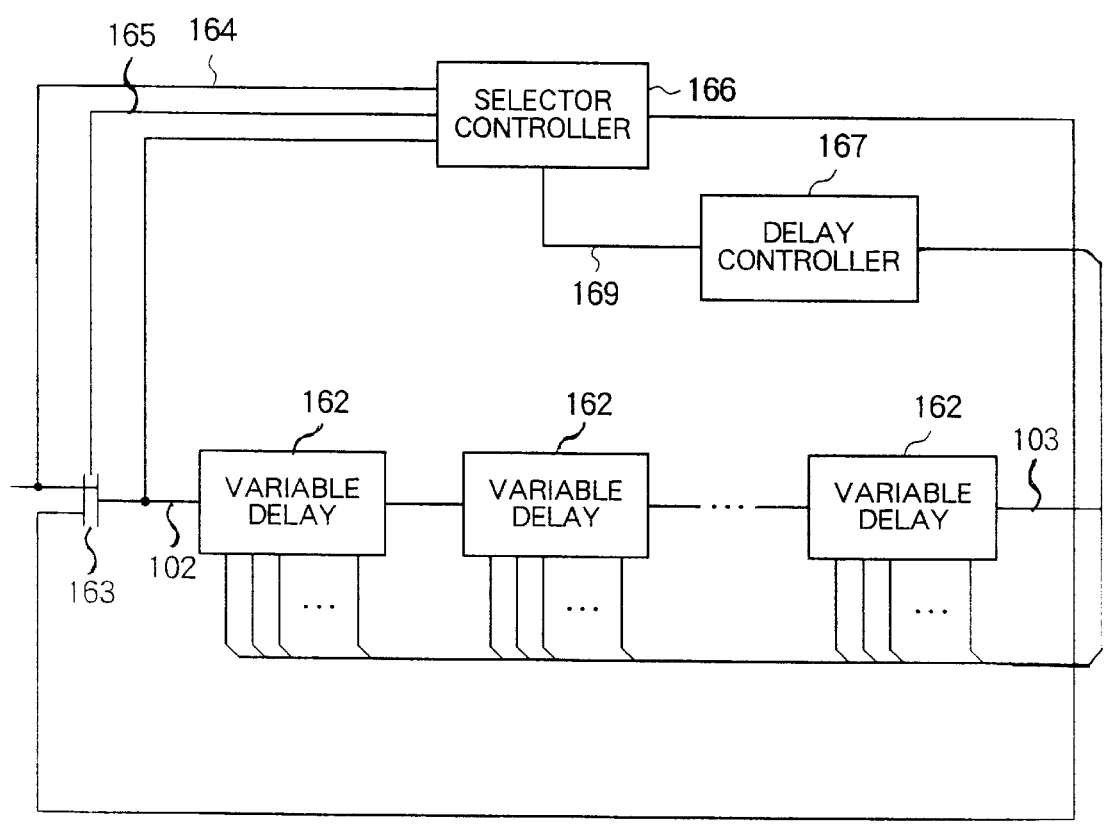
FIG. 14 is a block diagram of a variable delay circuit according to an eighth embodiment of the present invention.

Referring to FIG. 14, a variable delay circuit according to an eighth embodiment of the present invention is similar to the embodiment of FIG. 13 except for a plurality of (M) variable delay sections 162 in the present embodiment which are similar to those shown in FIG. 8. The operation of the variable delay circuit of the present embodiment is similar to that shown in FIG. 13, and will be further detailed below by way of a specific example.

Back to FIG. 13, for example, if it is assumed that a set of control signals for the variable delay sections 161 is not controlled based on the count of the selector controller 166, which is similar to the operation in the variable delay circuit of FIG. 9. Further assuming that setting K/2 of the count is three (K=6) and the number M of the delay sections 161 is three (M=3) and that "n" for the n-th pair which are ON is assumed seven (n=7) in each of the variable sections 161 to obtain a delay time of 7 units (for simplicity), the resultant delay time obtained by the variable delay circuit is 7×3×6= 126 units. If "n" is changed from 7 to 6 or 8 in the above case, the resultant delay time is 6×3×6=108 units or 8×3× 6=144 units. Namely, the delay time changes from 108 to 144 by incrementing the number of "n" by 2.

On the other hand, when the delay control section 167 is activated for controlling the control inputs for each of the delay sections 161, and if the delay control section 167 selects 6 or 8 instead of 7 only at the first count in the selector controller 166 and selects 7 at other counts for five times, the resultant delay is obtained as follows:

(7×3×5)+(6×3×1)=123 for n=6, or (7×3×5)+(8×3×1)=129 for n=8.

Namely, the delay time control section achieves a smaller rate of change between 123 and 129 by incrementing "n" by 2, thereby obtaining a fine adjustment of the delay time, with a smaller number of variable delay sections.

Since the above embodiments are described only for examples, the present invention is not limited to the above embodiments and various modifications or alterations can be easily made therefrom by those skilled in the art without departing from the scope of the present invention.

What is claimed is:

1. A variable delay circuit comprising a gate element for receiving a first signal to output a second signal corresponding to said first signal through an output line: a plurality of (N) delay elements each having a control input for receiving a corresponding one of a set of N control signals to delay a signal change of said second signal; and a capacitor having a first terminal connected to a source line, wherein said delay elements include N parallel MOSFETs connected between a second terminal of said capacitor and said output line; and wherein a difference between a first delay provided by a n-th delay element and a second delay provided by a (n+1) th delay element is substantially constant and not equal for any of n's between 1 and n−1.

2. A variable delay circuit comprising a plurality of cascaded variable sections each having: a gate element for receiving a first signal to output a second signal corresponding to said first signal; a plurality of (N) delay elements each having a control input for receiving a corresponding one of a set of N control signals to delay a signal change of said second signal; and a selector having a first input for receiving an input signal; a second input connected to the output of the last stage of said variable delay sections and an output connected to the input of the first stage of said variable delay section.

3. A variable delay circuit as defined in claim 2, wherein a difference between a first delay provided by a n-th delay element and a second delay provided by a (n+1)th delay element is substantially constant for any of n's between 1 and N−1 in each of said plurality of cascaded variable delay sections.

4. A variable delay circuit as defined in claim 2, wherein each said gate element has a first current terminal and a second current terminal for operation, and each of said delay elements includes at least one of a pMOSFETs connected between a first source line and said first current terminal and an nMOSFETs connected between a second source line and said second current terminal.

5. A variable delay circuit comprising a plurality of cascaded variable delay sections each having a gate element for receiving a first signal to output a second signal corresponding to said first signal; and a plurality of (N) delay elements each having a control input for receiving a corresponding one of a set of N control signals to delay a signal change of said second signal wherein each of said variable delay sections further comprises a capacitor having a first terminal connected between a source line, and said delay elements include N parallel MOSFETs connected between a second terminal of said capacitor and said output line.

6. A variable delay circuit comprising a gate element for receiving a first signal to output a second signal corresponding to said first signal through an output line, a plurality of (N) delay elements each having a control input for receiving a corresponding one of a set of N control signals to delay a signal change of said second signal, a difference between a first delay provided by a n-th delay element and a second delay provided by a (n+1) th delay element is substantially constant for any of n's between 1 and N−1, a plurality of cascaded variable delay sections each having: a gate element for receiving a first signal to output a second signal corresponding to said first signal;

a plurality of (N) delay elements each having a control input for receiving a corresponding one of a set of N control signals to delay a signal change of said second signal; and a selector having a first input for receiving an input signal, a second output connected to an output of a last stage of said plurality of cascaded variable delay sections and an output connected to the input of a first stage of said variable delay section.

7. A variable delay circuit as defined in claim 6, further comprising a counter having a reset input for receiving said input signal, a count input connected to the input of said first stage of said variable delay sections and a control output for controlling said selector to select one of said input signal and the output of said last stage of said plurality of cascaded variable delay sections based on the count by said counter.

8. A variable delay circuit as defined in claim 7, further comprising a delay control section for selecting a set of control signals for said set of control inputs of each of said plurality of cascaded variable delay sections based on the count by said counter.

9. A variable delay circuit as defined in claim 8, wherein said delay control section selects different sets of control signals for respective said plurality of cascaded variable delay sections.

* * * * *